US007629650B2

(12) United States Patent
Onogi et al.

(10) Patent No.: US 7,629,650 B2
(45) Date of Patent: Dec. 8, 2009

(54) SEMICONDUCTOR DEVICE (75) Inventors: Tomohide Onogi, Anpachi-cho (JP); Yasuo Segawa, Kitagata-cho (JP)

(73) Assignee: Epson Imaging Devices Corporation, Nagano (JP)

( * ) Notice: Subject to any disclaimer, the term of this patent is extended or adjusted under 35 U.S.C. 154(b) by 228 days.

(21) Appl. No.: 11/657,008

(22) Filed: Jan. 24, 2007

(65) Prior Publication Data
US 2007/0170506 A1 Jul. 26, 2007

(30) Foreign Application Priority Data
Jan. 25, 2006 (JP) ............................. 2006-016433

(51) Int. Cl.
*H01L 27/12* (2006.01)
(52) U.S. Cl. .................... 257/347; 257/72; 257/59; 257/66; 438/149; 438/150
(58) Field of Classification Search ................ 257/347, 257/59, 72, 162, E31, E21, E27, E29; 349/42; 438/135, 197, 69, 29
See application file for complete search history.

(56) References Cited
U.S. PATENT DOCUMENTS
7,190,422 B2 * 3/2007 Mochizuki ................... 349/44

7,335,917 B2 * 2/2008 Koo et al. .................... 257/72
2005/0045890 A1 3/2005 Yamasaki

FOREIGN PATENT DOCUMENTS
CN  1580921  2/2005
JP  2005-117069  4/2005

* cited by examiner

*Primary Examiner*—Marcos D. Pizarro
*Assistant Examiner*—Sue Tang
(74) *Attorney, Agent, or Firm*—Morrison & Foerster LLP (57) ABSTRACT

The invention prevents the reduction of a display quality caused by a light leak current of a thin film transistor used in a display device. A lower metal layer is formed on a substrate, and a buffer film, a semiconductor layer, a gate insulation film, and a gate wiring are formed thereon in this order. An interlayer insulation film having contact holes is formed on the gate wiring. A source wiring and a drain wiring connected to a source and a drain of the semiconductor layer through the contact holes respectively extend onto the interlayer insulation film. The source wiring, the drain wiring, and the lower metal layer extend from contact hole side respectively to cover a region that does not extend over an end of the gate wiring in the width direction on or under the semiconductor layer and the gate wiring.

15 Claims, 8 Drawing Sheets

FIG.8
PRIOR ART

SEMICONDUCTOR DEVICE

CROSS-REFERENCE OF THE INVENTION

This application claims priority from Japanese Patent Application No. 2006-016433, the content of which is incorporated herein by reference in its entirety.

BACKGROUND OF THE INVENTION

1. Field of the Invention

The invention relates to a semiconductor device, particularly, a thin film transistor disposed in a display pixel of a display device.

2. Description of the Related Art

In general, a liquid crystal display device of an active matrix type is formed with a pixel selection thin film transistor in each of a plurality of display pixels arrayed in a matrix on an insulation substrate such as a glass substrate.

Figure 8:
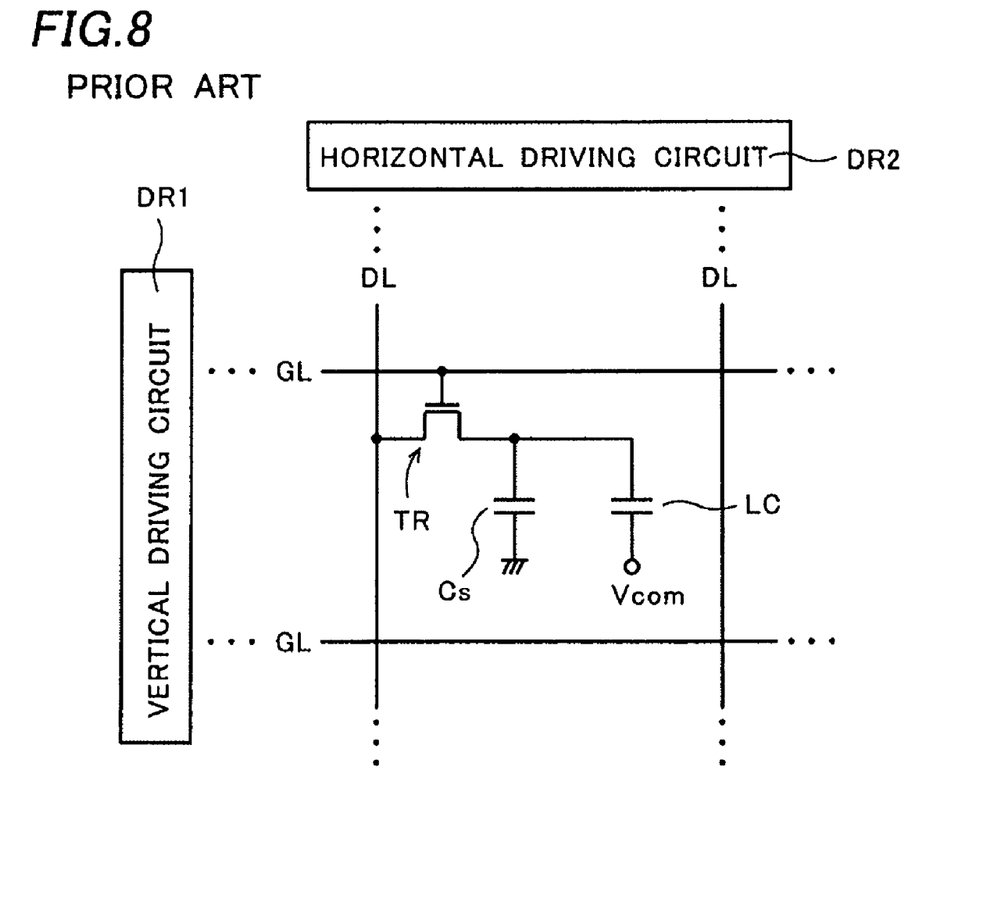
FIG. 8 is an equivalent circuit diagram of a display pixel of a liquid crystal display device.

FIG. 8 is an equivalent circuit diagram of a display pixel of a liquid crystal display device. FIG. 8 shows one of a plurality of display pixels disposed on an insulation substrate. As shown in FIG. 8, a gate wiring GL to which a pixel selection signal is supplied from a vertical driving circuit DR1 and a drain wiring DL to which a display signal is supplied from a horizontal driving circuit DR2 are crossing each other.

A pixel selection thin film transistor (hereafter, referred to as a "thin film transistor") TR is disposed in a region surrounded by the gate wiring GL and the drain wiring DL. A gate of the thin film transistor TR is connected to the gate wiring GL, and a drain thereof is connected to the drain wiring DL. A source of the thin film transistor TR is connected to a storage capacitor Cs storing a display signal and a pixel electrode as one of a pair of pixel electrodes interposing a liquid crystal LC therebetween. Another electrode of the pair of electrodes interposing the liquid crystal LC therebetween is connected to a common potential Vcom.

Next, the summary of the structure of the above-described display pixel will be described although not shown in the figure. A semiconductor layer made of, for example, a polysilicon layer is formed in a plurality of regions on an insulation substrate with a buffer film as an insulation film, for example, a silicon oxide film or a silicon nitride film interposed therebetween. The source and the drain are formed in the semiconductor layer by adding an impurity thereto, the semiconductor layer being an active layer of the above-described thin film transistor. A channel is formed between the source and the drain. Another semiconductor layer forming the above-described storage capacitor is formed adjacent to this semiconductor layer or at a distance from this semiconductor layer.

A gate insulation film made of, for example, a silicon oxide film or a silicon nitride film is formed on the buffer film, covering the semiconductor layer. A gate wiring made of, for example, chromium or molybdenum is formed on the gate insulation film, being partially opposed to the semiconductor layer. The gate wiring on the semiconductor layer that is the active layer is a gate electrode of the thin film transistor, and another semiconductor layer forms the storage capacitor together with the gate insulation film and the gate wiring. An interlayer insulation film made of, for example, a silicon oxide film or a silicon nitride film is formed on the gate insulation film, covering the gate wiring.

Furthermore, the interlayer insulation film on the source and drain of the semiconductor layer is provided with contact holes. A source wiring and a drain wiring are formed on the interlayer insulation film, being connected to the source and the drain through the contact holes respectively.

Furthermore, a planarization film is formed on the interlayer insulation film, covering the source wiring and the drain wiring and having an opening in a position on a part of the source wiring. A pixel electrode is formed on the planarization film, being connected to the source wiring through the opening. A first alignment film is formed on the pixel electrode. A common substrate formed with a second alignment film and a common electrode is disposed being opposed to the pixel electrode. A liquid crystal is sealed between the first alignment film and the second alignment film. The common electrode is connected to a common potential Vcom.

The relevant technology is disclosed in Japanese Patent Application Publication No. 2005-117069.

In the thin film transistor of the conventional art, however, external light, display light from the display pixel, or reflected light of these enters a depletion region of the semiconductor layer to generate an electron-hole pair and cause a light leak current, thereby degrading a display quality. The depletion region of the semiconductor layer means a region formed between the source or drain and the channel of the thin film transistor, where carriers do not exist.

SUMMARY OF THE INVENTION

The invention is made in consideration of the above problem, and minimizes the degradation of a display quality caused by a light leak current of a thin film transistor used in a display device.

The invention provides a semiconductor device including: an insulation substrate; a buffer film formed on the insulation substrate; a semiconductor layer formed on the buffer film; a source and a drain made by adding an impurity to the semiconductor layer; a gate insulation film formed on the buffer film, covering the semiconductor layer; a gate wiring formed on the gate insulation film, partially overlapping the semiconductor layer; an interlayer insulation film formed on the gate insulation film, covering the gate wiring; a contact hole formed in the interlayer insulation film on the source and the drain; a source wiring connected to the source through the contact hole and extending onto the interlayer insulation film; and a drain wiring connected to the drain through the contact hole and extending onto the interlayer insulation film, in which the source wiring or the drain wiring terminates on the gate wiring. Here, the source wiring or the drain wiring terminates in a region on the gate wiring overlapping the semiconductor layer.

In the semiconductor device of the invention, the drain wiring linearly extends, overlapping the semiconductor layer. The semiconductor device of the invention further includes a metal layer formed on the insulation substrate, in which the metal layer extends from a contact hole side and terminates in a region under the gate wiring overlapping the semiconductor layer. Furthermore, the semiconductor device of the invention is disposed in a display pixel of a liquid crystal display device and used in a pixel selection transistor selecting the display pixel.

In the semiconductor device, i.e. the thin film transistor of the invention, the source wiring, the drain wiring, or the metal layer shields the semiconductor layer from light, so that the light leak current can be minimized. Therefore, the degradation of the display quality caused by the light leak current of the thin film transistor can be minimized.

Furthermore, the region formed with the source wiring, the drain wiring, or the metal layer contributing the light shield can be minimized. Therefore, when this semiconductor device is disposed in the display pixel of the display device, the reduction of the aperture ratio of the display pixel caused by the light shield can be prevented. This can prevent the reduction of the luminance of the display pixel.

DETAILED DESCRIPTION OF THE INVENTION

A semiconductor device, a thin film transistor, of an embodiment of the invention will be described referring to figures. This thin film transistor is a pixel selection thin film transistor disposed in each of display pixels in the similar manner to a thin film transistor TR disposed in a display pixel of a liquid crystal display device shown in FIG. 8. Structures other than the thin film transistor are the same as the conventional art.

Figure 1A:
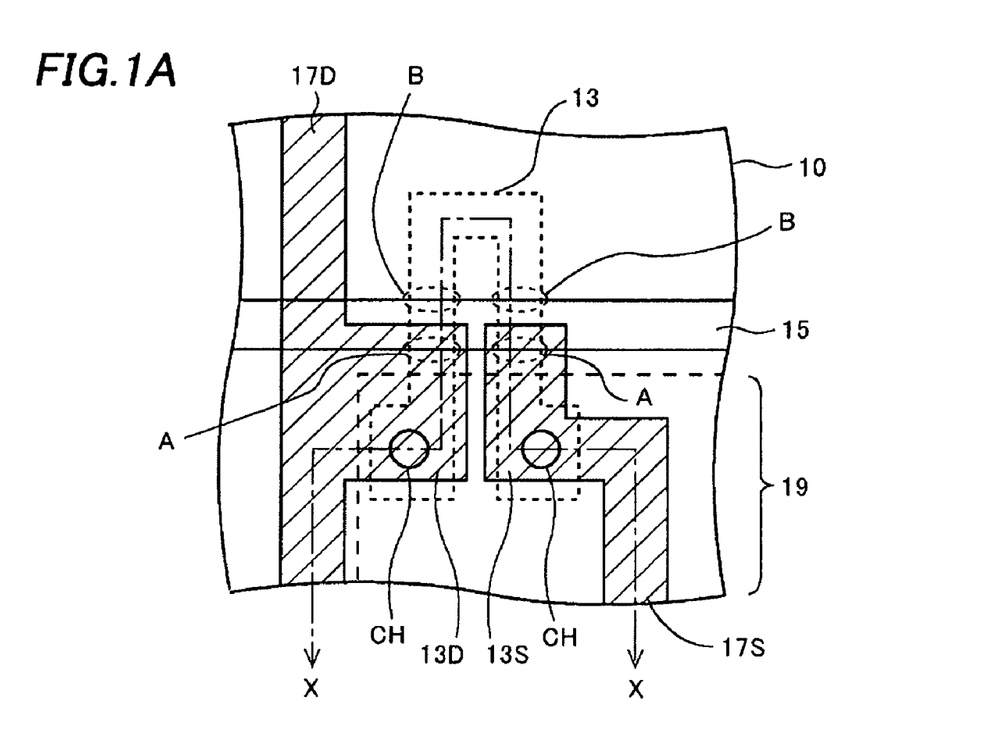
FIGS. 1A and 1B are plan views of a thin film transistor of an embodiment of the invention.
Figure 1B:
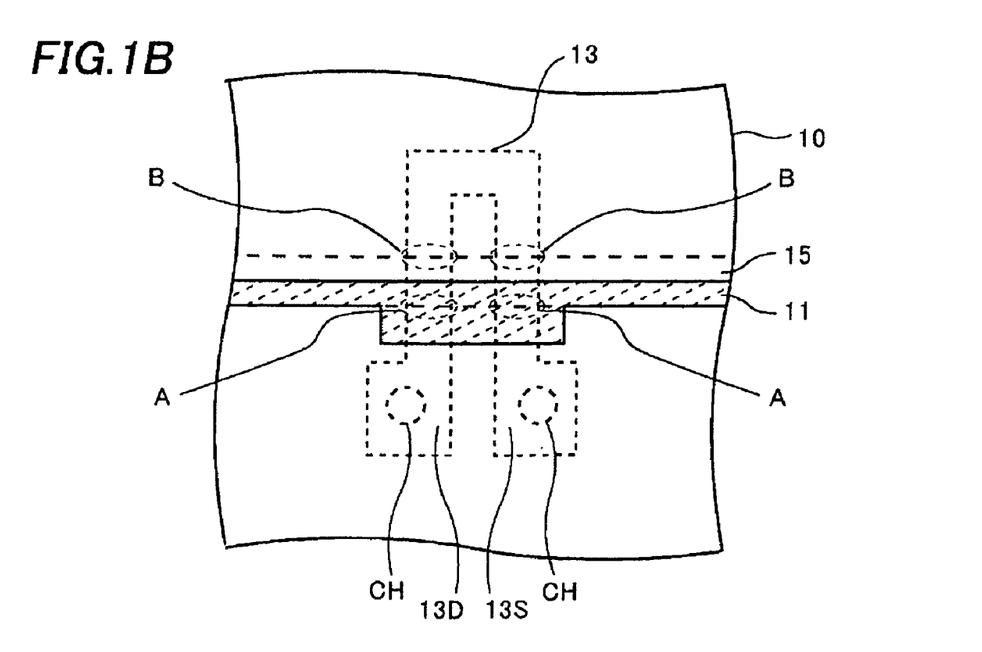
Figure 2:
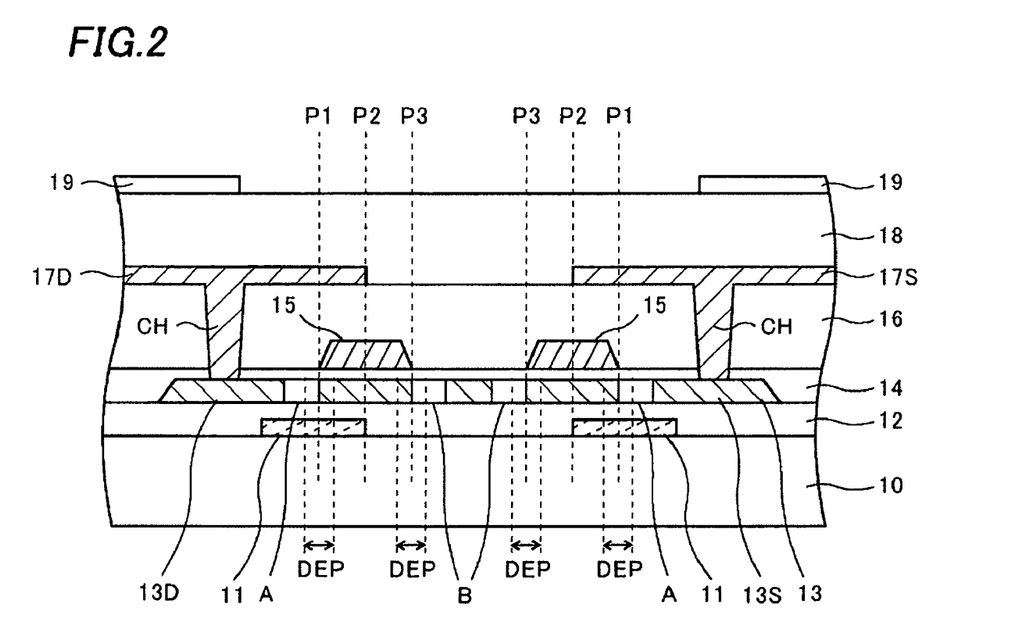
FIG. 2 is a cross-sectional view of FIG. 1 along line X-X.

First, the summary of the structure of the thin film transistor of this embodiment will be described. FIGS. 1A and 1B are plan views of the thin film transistor of this embodiment of the invention. FIG. 1A shows only components necessary for describing the layout of a source wiring and a drain wiring that will be described below. FIG. 1B shows the same plane as that shown in FIG. 1A, and shows only components necessary for describing the layout of a lower metal layer shielding a substrate side from light that will be described below. FIG. 2 is a cross-sectional view of FIG. 1A along line X-X. In FIG. 2, descriptions will be omitted about the structure of layers above a pixel electrode that will be described below.

As shown in FIGS. 1A, 1B and 2, a lower metal layer 11 having a function of shielding the thin film transistor from light is formed on an insulation substrate (hereafter, referred to as a "substrate") 10 such as a glass substrate. A buffer film 12 made of, for example, an insulation film such as a silicon oxide film or a silicon nitride film is formed on the substrate 10, covering the lower metal layer 11.

A semiconductor layer 13 having a linear portion is formed on the buffer film 12, overlapping a part of the lower metal layer 11. This semiconductor layer 13 is a polysilicon layer made by, for example, laser-annealing an amorphous silicon layer. Alternatively, the semiconductor layer 13 can be a semiconductor layer made of the other layer than the polysilicon layer. For example, the semiconductor layer 13 can be made of an amorphous silicon layer partially or entirely. The semiconductor layer 13 is formed with a source 13S and a drain 13D made by adding a high concentration impurity thereto.

The semiconductor layer 13 is formed with low concentration layers A in regions adjacent to the source 13S and the drain 13D, that are made by adding low concentration impurities thereto. The semiconductor layer 13 is also formed with low concentration layers B under ends of the gate wiring 15 on the opposite sides to the low concentration layers A, that are made by adding low concentration impurities thereto. A channel exists between the low concentration layer A and the low concentration layer B. That is, this thin film transistor has an LDD (lightly doped drain) structure. Depletion regions DEP where carriers do not occur when the thin film transistor turns off exist in adjoined portions of the channel and the low concentration layers A and B.

A gate insulation film 14 made of, for example, a silicon oxide film or a silicon nitride film is formed on the buffer film 12, covering the semiconductor layer 13. A gate wiring 15 made of, for example, chromium or molybdenum is formed on the gate insulation film 14, being partially opposed to the semiconductor layer 13. The gate wiring 15 on the semiconductor layer 13 is a gate electrode of the thin film transistor. An interlayer insulation film 16 made of, for example, a silicon oxide film or a silicon nitride film is formed on the gate insulation film 14, covering the gate wiring 15.

Contact holes CH are provided in the interlayer insulation film 16 on the source 13S and the drain 13D of the semiconductor layer 13. A source wiring 17S and a drain wiring 17D are formed on the interlayer insulation film 16, being connected to the source 13S and the drain 13D through the contact holes CH respectively. The source wiring 17S and the drain wiring 17D are made of, for example, metal including aluminum, and have a function of shielding the semiconductor layer 13 from light as described below.

A planarization film 18 is formed on the interlayer insulation film 16, covering the source wiring 17S and the drain wiring 17D and having an opening (not shown) in a portion on a part of the source wiring 17S. A pixel electrode 19 is formed on the planarization film 18, being connected to the source wiring 17S through the opening (not shown). Although the layers thereabove are not shown in the figure, a first alignment film is formed on the pixel electrode 19. A common substrate formed with a second alignment film and a common electrode is disposed being opposed to the pixel electrode 19. A liquid crystal is sealed between the first alignment film and the second alignment film. The common electrode is connected to a common potential Vcom.

Next, descriptions will be given on the layout of the source wiring 17S and the drain wiring 17D as the detailed structure of the thin film transistor having the above-described structure referring to figures in detail. As shown in FIGS. 1A and 2, the source wiring 17S and the drain wiring 17D terminate in a region on the gate wiring 15 overlapping the semiconductor layer 13. That is, each of the source wiring 17S and the drain wiring 17D covers a region that does not extend over an end P3 of the gate wiring 15 in the width direction on the semiconductor layer 13 and the gate wiring 15 when each of the contact holes CH is a start point.

With this structure, the source wiring 17S and the drain wiring 17D have a first shield function of shielding at least a region where the low concentration layer A is formed from light entering from thereabove. This first light shield function minimizes a light leak current caused by light entering the depletion region DEP of the semiconductor layer 13, and minimizes the degradation of a display quality.

Figure 3:
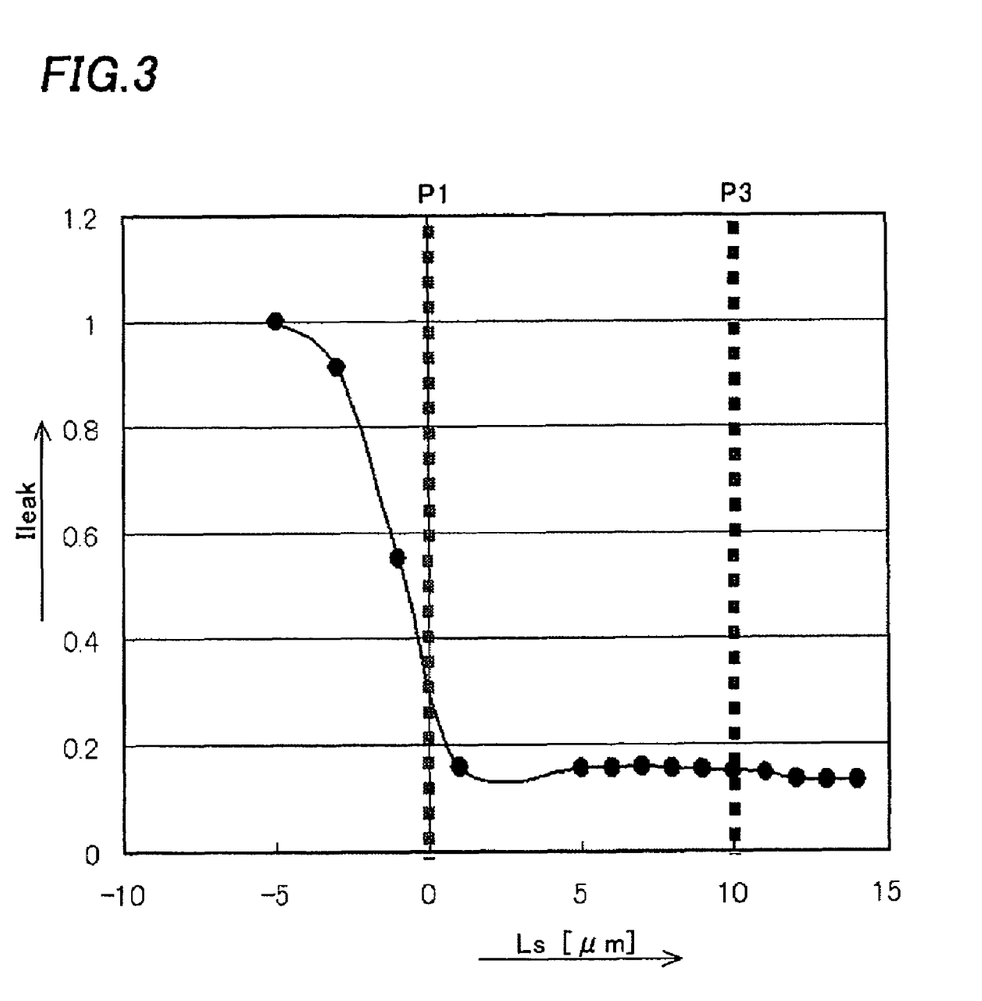
FIG. 3 is a characteristic graph showing the relation of a light leak current and a light shield length of the thin film transistor of the embodiment of the invention.

The above-described layout of the source wiring 17S and drain wiring 17D is based on the observations summarized in FIG. 3. FIG. 3 is the characteristic graph showing the relation of the light leak current and the light shield length of the thin film transistor of the embodiment of the invention. Here, the light leak current occurring in the thin film transistor is referred to as $I_{leak}$. The light shield length means the length of the source wiring 17S or the drain wiring 17D extending in the width direction of the gate wiring toward the end P3 that is opposed to an end P1 closer to the contact hole CH when the end P1 is a base point. That is, the distance between P1 and P2 in FIG. 2. This is referred to as a light shield length Ls.

As shown in FIG. 3, the light leak current $I_{leak}$ rapidly reduces around 0 of the light shield length, that is, around a point over the end P1. The negative value of Ls means that the wiring 17S or 17D does not reach the corresponding P1 position and part of the low concentration layer A is not covered by the wiring. However, even when the light shield length Ls further extends and overpasses the end P3 that is opposed to the end P1 of the gate wiring 15 in the width direction, the light leak current $I_{leak}$ keeps constant or almost constant and does not reduce. That is, the layout of the source wiring 13S and the drain wiring 13D having the light shield length Ls extending over the P3 of the gate wiring is not considered to contribute to the further reduction of the light leak current $I_{leak}$. Therefore, in this embodiment, each of the source wiring 17S and the drain wiring 17D covers the region that does not extend over the end P3 of the gate wiring 15 in the width direction on the semiconductor layer 13 and the gate wiring 15 when each of the contact holes CH is a start point.

Furthermore, as shown in FIGS. 1B and 2, in the similar manner, the lower metal layer 11 extends from the contact hole CH side and terminates in a region under the gate wiring 15 overlapping the semiconductor layer 13, based on the above-described characteristic graph of FIG. 3. That is, the lower metal layer 11 extends from the contact hole CH side to cover a region that does not extend over the end P3 of the gate wiring 15 in the width direction under the semiconductor layer 13 and the gate wiring 15.

With this structure, the lower metal layer 11 has a second light shield function of shielding at least the region where the low concentration layer A is formed from light entering from thereunder. This second light shield function prevents the light leak current caused by light entering the depletion region DEP of the semiconductor layer 13 more certainly together with the first light shield function, and prevents the degradation of the display quality.

With the above-described structure, the realization of the first and second light shield functions has an effect on an aperture ratio as described below. Next, a reference example of a thin film transistor disposed in a display pixel of a liquid crystal display device will be described for describing the effect.

Figure 4A:
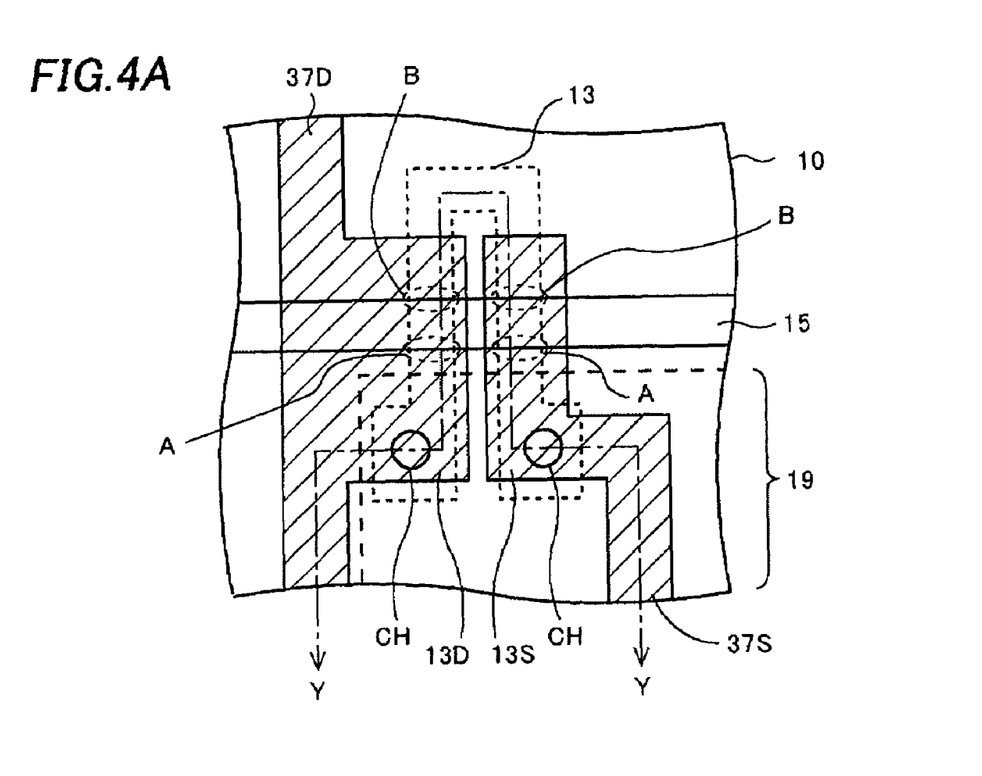
FIGS. 4A and 4B are plan views of a thin film transistor of a reference example.
Figure 4B:
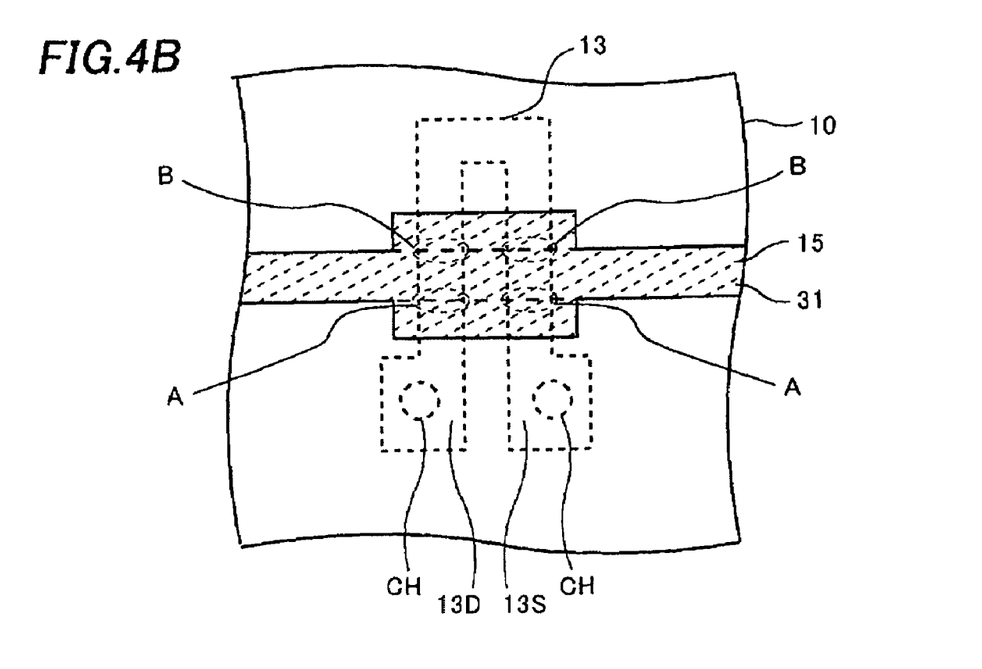
Figure 5:
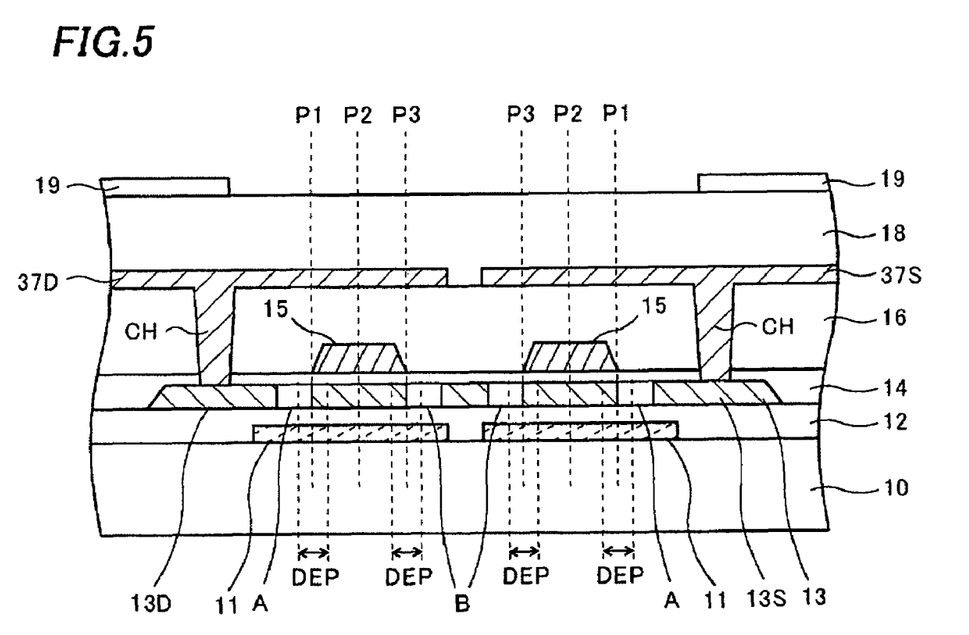
FIG. 5 is a cross-sectional view of FIG. 4 along line Y-Y.

FIGS. 4A and 4B are plan views of the thin film transistor of the reference example. FIG. 4A shows only components necessary for describing the layout of a source wiring and a drain wiring that will be described below. FIG. 4B shows the same plane as that shown in FIG. 4A, and shows only components necessary for describing the layout of a lower metal layer shielding a substrate side from light that will be described below. FIG. 5 is a cross-sectional view of FIGS. 4A and 4B along line Y-Y. In FIGS. 4A, 4B, and 5, the same numerals are given for the same components as those shown in FIGS. 1A, 1B, and 2, and the description thereof will be omitted.

As shown in FIGS. 4A and 5, this thin film transistor differs from the above-described embodiment in that each of a source wiring 37S and a drain wiring 37D covers a region that extends over the end P3 of the gate wiring 15 in the width direction on the semiconductor layer 13 and the gate wiring 15 from each of the contact holes CH as a start point. Therefore, there occurs a problem that the aperture ratio of the display pixel reduces.

As shown in FIGS. 4B and 5, in the similar manner, a lower metal layer 31 also extends from the contact hole CH side to cover a region that extends over the end P3 of the gate wiring 15 in the width direction under the semiconductor layer 13 and the gate wiring 15. With this structure, too, there occurs the problem that the aperture ratio of the display pixel reduces.

On the other hand, in this embodiment, each of the source wiring 17S and the drain wiring 17D covers the region that does not extend over the end P3 of the gate wiring 15 in the width direction on the semiconductor layer 13 and the gate wiring 15. Furthermore, the lower metal layer 11 covers the region that does not extend over the end P3 of the gate wiring 15 in the width direction under the semiconductor layer 13 and the gate wiring 15. This can keep the larger aperture ratio of the display pixel than in the above-described reference example. In other words, this embodiment has an effect that the above-described first and second light shield functions can be realized without reducing the aperture ratio of the display pixel. As a result, while the reduction of luminance of the display pixel caused by the reduction of the aperture ratio is minimized, the light leak current can be minimized.

Figure 6A:
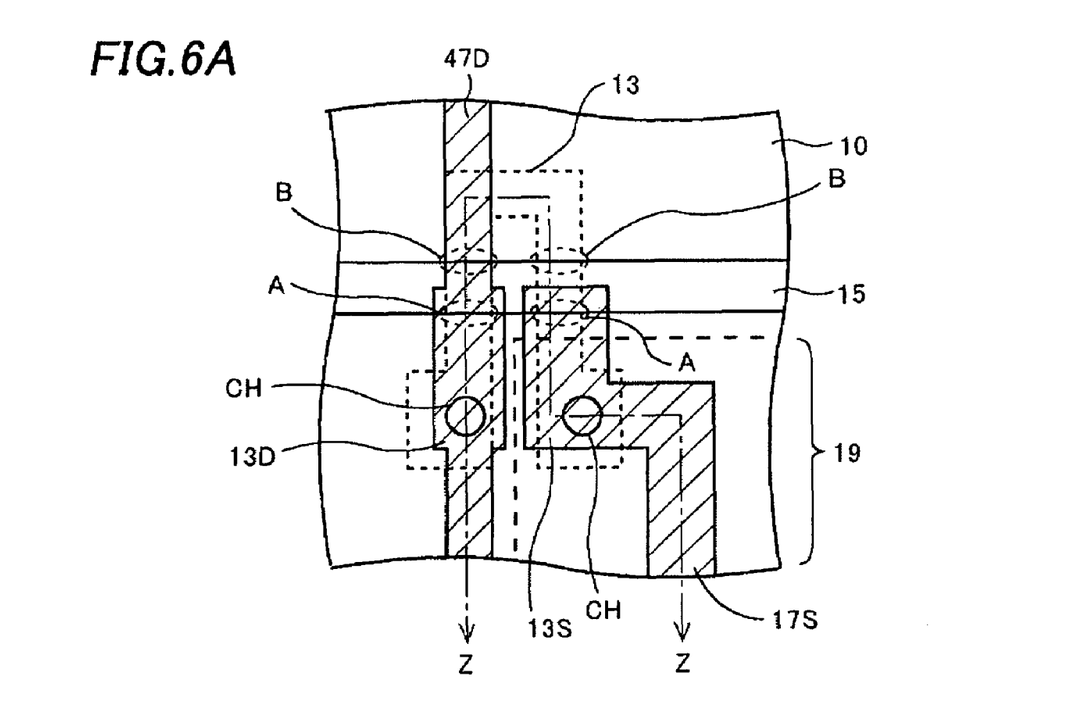
FIGS. 6A and 6B are plan views of a thin film transistor of the other embodiment of the invention.
Figure 6B:
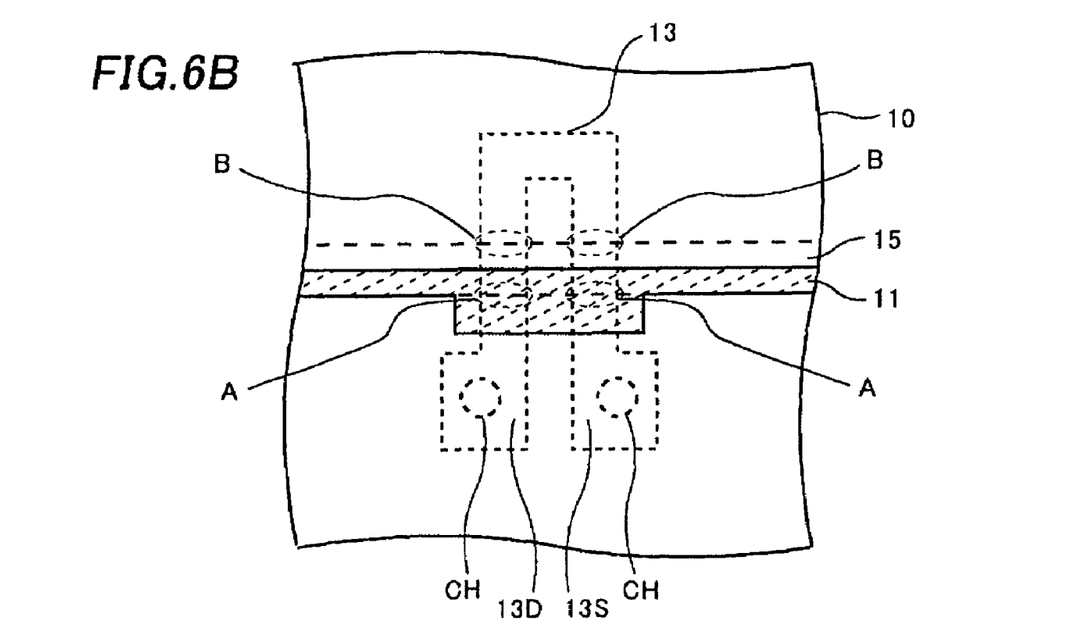
Figure 7:
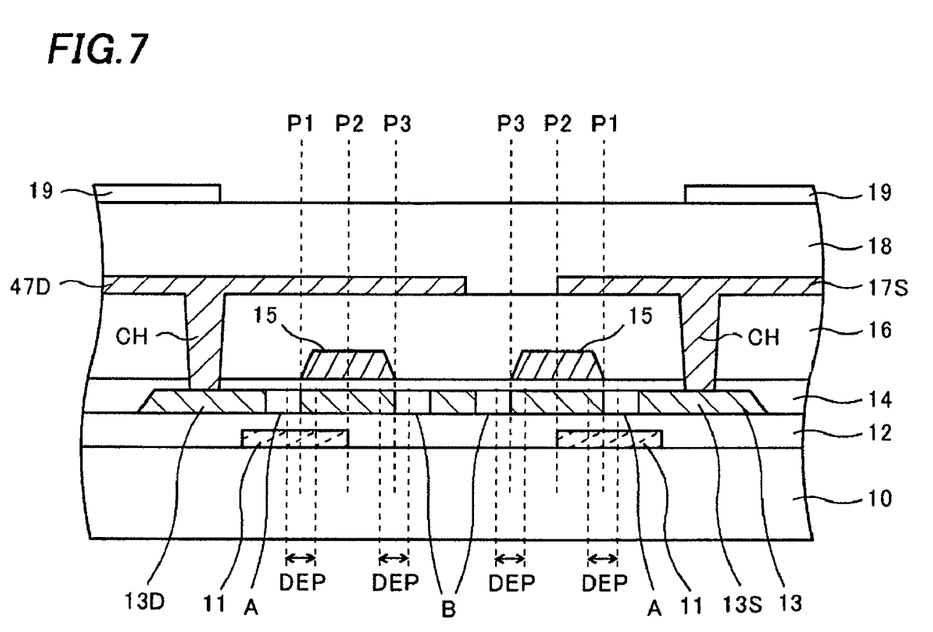
FIG. 7 is a cross-sectional view of FIG. 6 along line Z-Z.

FIGS. 6A, 6B and 7 show a modification to the embodiment shown in FIGS. 1A, 1b and 2. FIGS. 6A and 6B are plan views of a thin film transistor of the other embodiment of the invention. FIG. 6A shows only components necessary for describing the layout of a drain wiring that will be described below. FIG. 6B shows the same plane as that shown in 6A, and shows only components necessary for describing the layout of a lower metal layer shielding a substrate side from light that will be described below. FIG. 7 is a cross-sectional view of FIGS. 6A and 6B along line Z-Z. In FIGS. 6A, 6B, and 7, the same numerals are given to the same components as those shown in FIGS. 1A, 1B, and 2, and the description thereof will be omitted. The lower metal layer of this thin film transistor is the same as the lower metal layer 11 shown in FIGS. 1B and 2.

As shown in FIGS. 6A and 7, a drain wiring 47D covers a region that extends over the end P3 of the gate wiring 15 in the width direction from the contact hole CH as a start point on the semiconductor layer 13 and the gate wiring 15. However, since the drain wiring 47D has a linear form or an almost linear form and extends along a linear portion of the semiconductor layer 13 thereon, compared with the reference example, the reduction of the aperture ratio of the display pixel can be minimized. That is, in this case, too, while the reduction of the luminance of the display pixel caused by the reduction of the aperture ratio is minimized, the light leak current can be minimized.

The invention can be also applied to the case where the source 13S is replaced by a drain and the drain 13D is replaced by a source in the semiconductor layer 13 of the above-described both embodiments. In this case, the source wiring 17S is formed as a drain wiring and the drain wirings 17D and 47D are formed as source wirings.

Furthermore, although the thin film transistor of both the above-described embodiments is disposed in the display pixel of the liquid crystal display device, the invention is not limited to this. That is, the invention can be applied to a thin film transistor disposed in the other display device than the liquid crystal display device or the other device than the display device as long as it is used in the environment exposed to light.

What is claimed is:

1. A semiconductor device comprising:
   an insulation substrate;
   a semiconductor layer disposed on the insulation substrate, the semiconductor layer comprising a source, a drain, a channel disposed between the source and the drain and a low impurity concentration region disposed between the channel and the source or between the channel and the drain, the low impurity concentration region having an impurity concentration lower than an impurity concentration of the source or the drain;

a gate insulation film disposed on the semiconductor layer;

a gate wiring disposed on the gate insulation film;

an interlayer insulation film disposed on the gate wiring;

a source wiring disposed on the interlayer insulation film and connected with the source; and a drain wiring disposed on the interlayer insulation film and connected with the drain, wherein a lateral edge of the source wiring or the drain wiring is positioned between a first lateral edge of the gate wiring and a second lateral edge of the gate wiring, the first and second lateral edges defining a width of the gate wiring, and in plan view of the semiconductor device, the low impurity concentration region is covered completely by the source wiring or the drain wiring.

2. The semiconductor device of claim 1, wherein said lateral edge of the source wiring or the drain wiring is positioned above the channel of the semiconductor layer.

3. The semiconductor device of claim 1, wherein the drain wiring and the semiconductor layer extend in the same direction.

4. The semiconductor device of claim 2, wherein the drain wiring and the semiconductor layer extend in the same direction.

5. The semiconductor device of claim 2, further comprising a metal layer disposed between the insulation substrate and the semiconductor layer, a lateral edge of the metal layer being positioned between the first and second lateral edges of the gate wiring.

6. The semiconductor device of claim 3, further comprising a metal layer disposed between the insulation substrate and the semiconductor layer, a lateral edge of the metal layer being positioned between the first and second lateral edges of the gate wiring.

7. The semiconductor device of claim 4, further comprising a metal layer disposed between the insulation substrate and the semiconductor layer, a lateral edge of the metal layer being positioned between the first and second lateral edges of the gate wiring.

8. A liquid crystal display device comprising:

a insulation substrate; and a pixel selection transistor disposed on the insulation substrate, wherein the pixel selection transistor comprising;

a semiconductor layer disposed on the insulation substrate, the semiconductor layer comprising a source, a drain, a channel disposed between the source and the drain and a low impurity concentration region disposed between the channel and the source or between the channel and the drain, the low impurity concentration region having an impurity concentration lower than an impurity concentration of the source or the drain, a gate insulation film disposed on the semiconductor layer, a gate wiring disposed on the gate insulation film, an interlayer insulation film disposed on the gate wiring, a source wiring disposed on the interlayer insulation film and connected with the source, and a drain wiring disposed on the interlayer insulation film and connected with the drain, wherein a lateral edge of the source wiring or the drain wiring is positioned between a first lateral edge of the gate wiring and a second lateral edge of the gate wiring, the first and second lateral edges defining a width of the gate wiring, and in plan view of the display device, the low impurity concentration region is covered completely by the source wiring or the drain wiring.

9. The liquid crystal display device of claim 8, wherein said lateral edge of the source wiring or the drain wiring is positioned above the channel of the semiconductor layer.

10. The liquid crystal display device of claim 8, wherein the drain wiring and the semiconductor layer extend in the same direction.

11. The liquid crystal display device of claim 9, wherein the drain wiring and the semiconductor layer extend in the same direction.

12. The liquid crystal display device of claim 10, further comprising a metal layer disposed between the insulation substrate and the semiconductor layer, a lateral edge of the metal layer being positioned between the first and second lateral edges of the gate wiring.

13. The liquid crystal display device of claim 11, further comprising a metal layer disposed between the insulation substrate and the semiconductor layer, a lateral edge of the metal layer being positioned between the first and second lateral edges of the gate wiring.

14. The semiconductor device of claim 1, wherein the semiconductor layer intersects the gate wiring at least twice between the source and the drain in plan view of the semiconductor device.

15. The semiconductor device of claim 3, wherein the semiconductor layer intersects the gate wiring at least twice between the source and the drain in plan view of the semiconductor device.

* * * * *